United States Patent

Leunbach et al.

[11] Patent Number: 6,008,644
[45] Date of Patent: Dec. 28, 1999

[54] NUCLEAR POLARIZATION ENHANCED NUCLEAR MAGNETIC RESONANCE IMAAGING

[75] Inventors: Ib Leunbach, Dragör, Denmark; Ian Young, London, United Kingdom; Gösta Ehnholm, Helsinki, Finland; Georg Hansson, Vellinge, Sweden; Stefan Petersson, Helsingborg, Sweden; Lars-Göran Wistrand, Lund, Sweden; Klaes Golman, Rungsted Kyst, Denmark

[73] Assignees: Picker Nordstar OY, Vantaa, Finland; Nycomed Imaging AS, Oslo, Norway

[21] Appl. No.: 08/888,317

[22] Filed: Jul. 3, 1997

Related U.S. Application Data
[60] Provisional application No. 60/049,075, Jun. 10, 1997.

[30] Foreign Application Priority Data

Jul. 5, 1996 [GB] United Kingdom .................... 9614139

[51] Int. Cl.$^6$ ........................................................ G01V 3/00
[52] U.S. Cl. ............................ 324/300; 324/307; 600/412
[58] Field of Search ...................................... 324/300, 307, 324/318, 316, 309; 600/413, 420

[56] References Cited

U.S. PATENT DOCUMENTS

| | | | |
|---|---|---|---|
| 5,154,603 | 10/1992 | Sepponen | 128/653.2 |
| 5,325,854 | 7/1994 | Ehnholm | 128/653.3 |
| 5,479,925 | 1/1996 | Dumoulin et al. | 128/653.3 |
| 5,578,922 | 11/1996 | Lurie et al. | 324/307 |
| 5,678,548 | 10/1997 | Murugesan et al. | 128/653.2 |
| 5,789,257 | 8/1998 | Tapper et al. | 436/173 |

*Primary Examiner*—Christine K. Oda
*Assistant Examiner*—Brij B. Shrivastav
*Attorney, Agent, or Firm*—Bacon & Thomas

[57] ABSTRACT

This invention relates to a method of electron spin resonance enhanced magnetic resonance imaging which relies on ex vivo dynamic nuclear polarisation of an MR imaging agent.

20 Claims, 8 Drawing Sheets

NUCLEAR POLARIZATION ENHANCED NUCLEAR MAGNETIC RESONANCE IMAAGING

This application claims benefit of copending provisional application Ser. No. 60/049,075, filed Jun. 10, 1997.

This invention relates to a method of electron spin resonance enhanced magnetic resonance imaging.

Magnetic resonance imaging (MRI) is a diagnostic technique that has become particularly attractive to physicians as it is non-invasive and does not involve exposing the patient under study to potentially harmful radiation such as X-rays.

Electron spin resonance enhanced MRI, referred to herein as OMRI (Overhauser MRI) but also referred to in earlier publications as ESREMRI or PEDRI, is a method of MRI in which enhancement of the magnetic resonance signals from which images may be generated is achieved by virtue of dynamic nuclear polarization (the Overhauser effect) that occurs on VHF stimulation of an ESR transition in a magnetic (usually paramagnetic but optionally for example superparamagnetic) material (hereinafter referred to as an OMRI contrast agent) in the subject under study. Magnetic resonance signal enhancement may be by a factor of a hundred or more thus allowing OMRI images to be generated rapidly and with relatively low primary magnetic fields.

OMRI techniques have been described by several authors, notably Leunbach, Lurie, Ettinger, Grücker, Ehnholm and Sepponen, for example in EP-A-296833, EP-A-361551; WO-A-90/13047, J. Mag. Reson. 76:366–370(1988), EP-A-302742, SMRM 9:619(1990), SMRM 6:24(1987), SMRM 7:1094(1988), SMRM 8:329 (1989), U.S. Pat. No. 4719425, SMRM 8:816(1989), Mag. Reson. Med. 14:140–147(1990), SMRM 9:617(1990), SMRM 9;612(1990), SMRM 9:121(1990), GB-A-2227095, DE-A-4042212 and GB-A-2220269. One area of particular interest is the use of OMRI in determining oxygen concentrations in a sample (eg. an animate body) and this is the subject of co-pending U.S. patent application Ser. No. 08/546,146 of Leunbach.

In the basic in vivo OMRI technique, the imaging sequence involves initially irradiating a subject placed in a uniform magnetic field (the primary magnetic field, $B_o$) with radiation, usually VHF radiation, of a frequency selected to excite a narrow linewidth ESR transition in an OMRI contrast agent which is in, or has been administered to, the subject. Dynamic nuclear polarization results in an increase in the population difference between the excited and ground nuclear spin states of selected nuclei, i.e. those nuclei, generally protons, which are responsible for the magnetic resonance signals (hereinafter the MR imaging nuclei). Since MR signal intensity is proportional to this population difference, the subsequent stages of each imaging sequence, performed essentially as in conventional MRI techniques, result in larger amplitude MR signals being detected. OMRI contrast agents which exhibit an ESR transition able to couple with an NMR transition of the MR imaging nuclei may be naturally present within the subject (eg. oxygen or melanin) or may be administered thereto.

Contrast agents useful in conventional methods of OMRI and suitable for in vivo administration have been reported in a number of publications In WO-A-88/10419 (Hafslund Nycomed Innovation AB), for example, various OMRI contrast agents were proposed with particular emphasis on the use of stable nitroxide free radicals, of the chloranil semiquinone radical or of Fremy's Salt. In WO-A-90/00904 (Hafslund Nycomed Innovation AB) the use of deuterated free radicals (e.g. deuterated nitroxide free radicals) as OMRI contrast agents was proposed. WO-A-91/12024 (Nycomed Innovation AB) refers generally to the use of carbon free radicals, i.e. radicals where the unpaired electron or electrons are associated primarily with carbon atoms (for example triarylmethyl radicals where the electron charge is delocalised over a number of aromatic nuclei). More specifically, the use in OMRI of triarylmethyl radicals in which at least one aryl moiety is a sulphur-based heterocycle is the subject of WO-A-96/39367 (Nycomed Imaging AS). The use in OMRI of free radicals in which the electron charge is delocalised through a conjugated carbon-based II-system is referred to in WO-A-93/02711 (Hafslund Nycomed Innovation AB). However, OMRI contrast agents are not limited to paramagnetic organic free radicals and particulate ferromagnetic, ferrimagnetic and superparamagnetic contrast agents have been proposed in UK Patent Application No. 9605482.0, filed on Mar. 15, 1996 in the name of Nycomed Imaging AS.

In a development of the in vivo OMRI technique, it has been suggested that OMRI contrast agents may be conveniently polarised (i.e. raised to a higher electron spin state) before injection into the subject. This is said to avoid problems associated with the poor penetration depth of high RF frequencies in bodily tissues.

To be successful as an in vivo OMRI contrast agent in conventional methods of OMRI, a chosen material must have inter alia the property of physiological tolerability. This factor alone imposes a severe limitation on the types of OMRI contrast agent which prove to be of real diagnostic utility. Organic free radicals, for example, are frequently unstable in physiological conditions or have very short half-lives leading to toxicity problems. It will often be the case that a radical found to give excellent Overhauser enhancement factors in vitro cannot be used diagnostically due to its physiological incompatibility. There is therefore a need for improved methods of OMRI which are more flexible, i.e. less constrained by physiological factors.

The present invention which represents a totally new departure from the prior art is based on a method of OMRI of a sample in which it is possible to avoid administering the whole of, or substantially the whole of, an OMRI contrast agent to a sample whilst still achieving the desired Overhauser enhanced contrast effect. The method relies on ex vivo dynamic nuclear polarisation of selected nuclei of an MR imaging agent by an OMRI contrast agent, the latter conveniently being disposed of prior to administration of the polarised MR imaging agent into the subject.

Thus viewed from one aspect the present invention provides a method of magnetic resonance investigation of a sample, preferably of a human or non-human animal body (eg. a mammalian, reptilian or avian body), said method comprising:

(i) placing a composition comprising an OMRI contrast agent and an MR imaging agent containing nuclei (MR imaging nuclei) capable of emitting magnetic resonance signals in a uniform magnetic field (eg. the primary magnetic field $B_0$);

(ii) exposing said composition to a first radiation of a frequency selected to excite electron spin transitions in said OMRI contrast agent;

(iii) separating the whole, substantially the whole, or a portion of said OMRI contrast agent from said MR imaging agent;

(iv) administering said MR imaging agent to said sample;

(v) exposing said sample to a second radiation of a frequency selected to excite nuclear spin transitions in said MR imaging nuclei;

(vi) detecting magnetic resonance signals from said sample; and (vii) optionally, generating an image or dynamic flow data from said detected signals.

Thus the invention involves the sequential steps of ex vivo dynamic nuclear polarisation of MR imaging nuclei, administration of polarised MR imaging nuclei in the absence of a portion of, preferably substantially the whole of, the OMRI contrast agent, and conventional in vivo MR signal generation and measurement. The MR signals obtained in this way may be conveniently converted into image data or flow data. The method according to the invention has a number of advantages over known in vivo methods of OMRI, some of which are referred to in detail below.

One of the advantages which the present method offers over conventional methods is that physiological tolerability of the OMRI contrast agent is less of a determining factor in the overall diagnostic utility of the method. Similarly, in conventional methods of OMRI, the diagnostic utility of OMRI contrast agents is subject to the constraints imposed by the physical and chemical characteristics of the administrable media in which the contrast agents are formulated, for example the deleterious effect the OMRI contrast agent may have on viscosity, pH, etc. of the formulation Once again, the method according to the invention is less constrained by such factors because the OMRI contrast agent need not be present in an administrable form. Moreover, factors such as biodegradability and biodistribution, on which the suitability of OMRI contrast agents for use in conventional OMRI methods may stand or fall, are of less importance in determining the suitability of the present invention for in vivo use.

In any conventional OMRI experiment carried out in vivo, there will be a number of secondary factors acting to relax the excited spin state back to equilibrium and reduce the amplitude of the MR signal obtained. In particular, MR imaging agents will be subject to local magnetic field inhomogeneities resulting, for example, from the presence of paramagnetic species such as iron (eg. in erythrocytes), or dissolved oxygen in the body fluid or of the radical itself responsible for Overhauser enhancement (i.e. radical self-broadening), all of which serve to increase the rate of relaxation. The relaxation rate will also be dependent on the temperature and chemical nature of the body fluid. The present method however alleviates these problems by providing Overhauser stimulation ex vivo. Thus the method allows the chemical environment, pH and temperature to be optimised by the operator and the effects of local magnetic field inhomogeneities such as those described above to be reduced. Overhauser enhancement is also strongly dependent on the density of the sample (ie. its structure) and in in vivo use there is the added problem of non-uniform radiation penetration into the large sample. This problem of course does not arise in the method according to the invention.

The coupling factor during VHF irradiation tends to decrease at higher magnetic field strengths thereby decreasing the Overhauser effect. The ability to apply the magnetic field ex vivo means that a lower magnetic field strength may be used than is appropriate for in vivo use.

Figure 1:
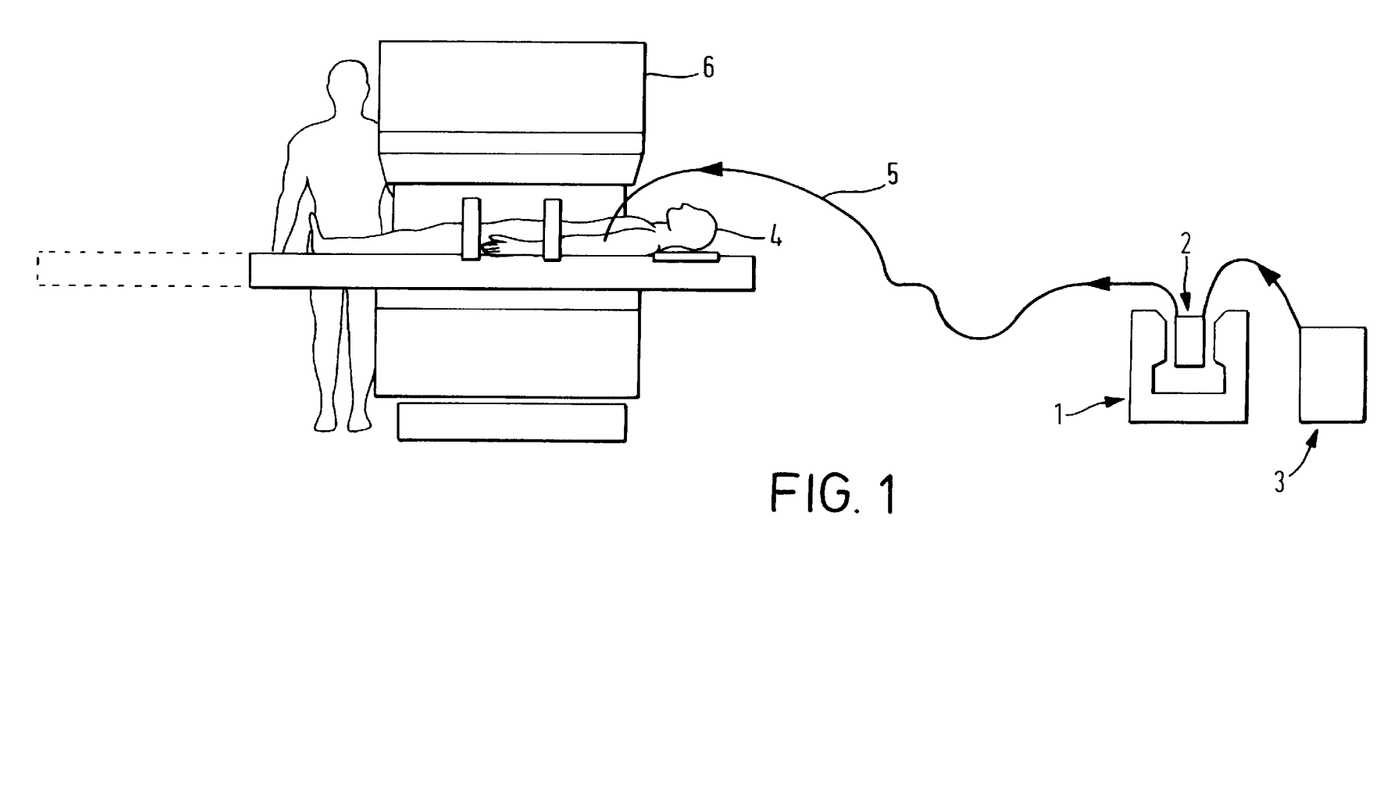

The method according to the invention may be conveniently carried out by using a first magnet for providing the polarising magnetic field and a second magnet for providing the primary magnetic field for MR imaging. Having a separate magnet dedicated to providing the dynamic nuclear polarisation allows the operator advantageously to optimize field strength independently of the MR imaging field. The OMRI apparatus suitable for use in such an embodiment may be standardized as it would be similar for all imaging applications, thereby making it cheap to manufacture and simple to use. Thus, an MR apparatus adapted for use in the method described hereinbefore provides a further aspect of the present invention, said apparatus comprising a first magnet providing a magnetic field for dynamic nuclear polarisation of a fluid and a second magnet providing the primary magnetic field for MR imaging of a subject (eg. an animate subject). FIG. 1 of the accompanying drawings is a schematic representation of one embodiment of the apparatus according to the invention. Therein a freestanding polarising magnet (1) optionally together with a filter surrounds an EPR resonator (2) which provides the nuclear polarisation. A container (3) comprising a pump is provided for carrying the contrast composition which is delivered to a subject (4) by a delivery line (5). The subject is situated within a conventional MR scanner (6).

Figure 2:
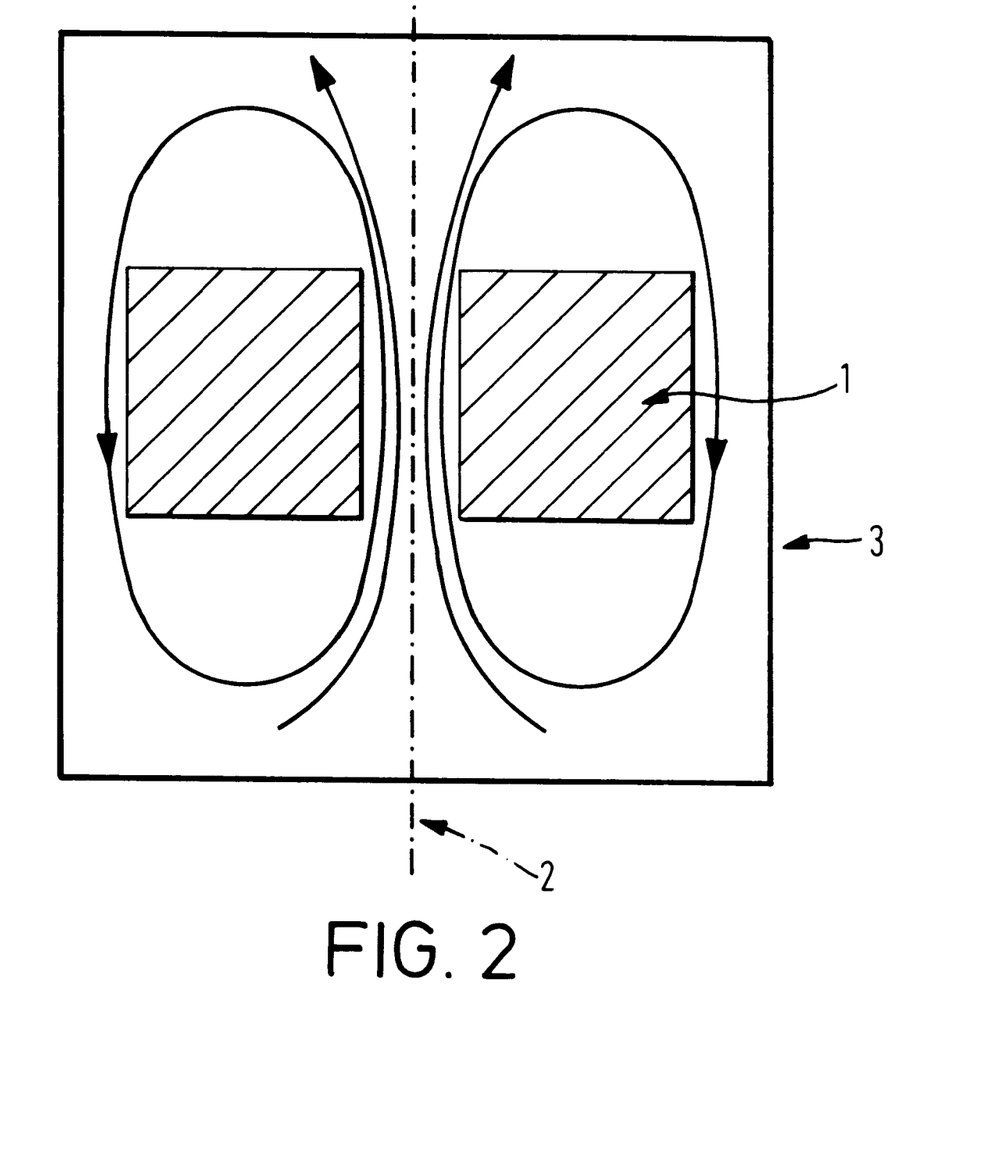

In one embodiment of the method and apparatus according to the invention, a dielectric resonator may be used in the dynamic nuclear polarization process. Generally speaking, dynamic nuclear polarisation requires a volume with a fairly strong high frequency magnetic field and an accompanying electric field which is made as small as possible. A dielectric resonator may be used to provide a preferred field arrangement in which the magnetic field lines are shaped like a straw in a sheaf of corn with an electric field forming circles like the thread binding the sheaf. A field arrangement of this type may be formed by one of several rings or tubes of a material with a high dielectric constant and low loss. The man skilled in the art will appreciate that such a tube will exhibit different electromagnetic resonant modes. One of the dominant modes has the desired characteristic of electric field circulating around the tube axis within the wall and being zero at the axis and everywhere perpendicular to it. The magnetic field on the other hand is concentrated around the tube axis and mainly directed along it. The composition to be polarised is conveniently placed inside the resonator which is itself placed inside a metal box with a clearance typically of the order of the size of the resonator, and is excited to the desired resonance with a coupling loop or the like. The metal box ensures that the electromagnetic energy does not leak away by radiation. FIG. 2 of the accompanying drawings shows a dielectric resonator (1) (with an axis of rotational symmetry (2)) within a metal box (3).

An alternative embodiment to the dielectric resonator is a resonant cavity of which several are known to those skilled in the art. One simple and efficient resonant cavity is a metal box, such as a cylindrical metal box. A suitable mode is the one known as TM1, 1, 0 which produces a perpendicular magnetic field on the axis of the cavity. It is possible to excite two such modes in the same cavity at the same frequency producing fields which are mutually perpendicular. By arranging them to have a 90° phase difference a rotating field can be produced which is especially efficient for implementing dynamic polarisation with a minimum of dissipation in the sample. Modes with similar field distributions for different shapes of cavities e.g. rectangular cavities are familiar to those skilled in the art.

In a further embodiment of the method and apparatus according to the invention, the composition may be dispersed into a plurality of compartments during the dynamic nuclear polarisation step. Thus the composition might be typically divided into parallel channels provided, for example, by parallel separating plates, discs or tubes, typically open-ended tubes. The electric losses (eddy currents) in the composition caused by the magnetic field are decreased by dividing the composition into smaller volumes using electrically isolating barriers, preferably situated perpendicular to the field. If the composition is in a cylindrical vessel surrounded by a dielectric resonator as described hereinbefore, the isolating barriers would be planes passing radially from the vessel axis to its wall. A simpler and more practical arrangement is to polarise the composition in a container which contains a plurality of thin-walled tubes of an isolating material such as quartz, glass or plastic. This has the advantage of reducing the electric losses in the composition which allows a larger volume of composition to be polarised for the same applied electromagnetic power. The walls, the inner, outer or both of the tubes may similarly serve as the substrate onto which the OMRI contrast agent is bound so that pressure applied to one end of the container may force the polarized, substantially OMRI contrast agent free, fluid MR imaging agent from the container, for example with a delivery line leading to the subject (patient) undergoing MR examination.

It is envisaged that in the method according to the invention, use may be made of any known OMRI contrast agent capable of effecting a diagnostically effective contrast enhancement in the sample to which the MR imaging agent is administered. Where the OMRI contrast agent is a paramagnetic free radical, the radical may be conveniently prepared in situ from a stable radical precursor by a conventional physical or chemical radical generation step shortly before the method according to the invention is effected. This is particularly advantageous where the radical has a short half-life. In these cases, the radical will normally be nonreusable and may conveniently be discarded once the separation step of the method according to the invention has been completed.

For the purposes of administration, the MR imaging agent should be administered in the absence of the whole of, or substantially the whole of, the OMRI contrast agent. Preferably at least 80% of the OMRI contrast agent is removed, particularly preferably 90% or more, especially preferably 95% or more, most especially 99% or more. In general, it is desirable to remove as much OMRI contrast agent as possible prior to administration to improve physiological tolerability and increase $T_1$.

Preferred OMRI contrast agents for use in the method according to the invention are those which can be conveniently and rapidly separated from the polarised MR imaging agent using known techniques as discussed below.

Preferably of course a chosen OMRI contrast agent will exhibit a long half-life (preferably at least one hour), long relaxation times ($T_{1e}$ and $T_{2e}$), high relaxivity and a small number of ESR transition lines. Thus the paramagnetic oxygen-based, sulphur-based or carbon-based organic free radicals or magnetic particles referred to in WO-A-88/10419, WO-A-90/00904, WO-A-91/12024, WO-A-93/02711 or WO-A-96/39367 would be suitable OMRI contrast agents for the present invention. A particularly preferred characteristic of a chosen OMRI contrast agent is that it exhibits low inherent ESR linewidths, preferably less than 500 mG, particularly preferably less than 400 mG, especially preferably less than 150 mG. Generally speaking, organic free radicals such as triarylmethyl and nitroxide radicals provide the most likely source of such desirably low linewidths eg. those described in WO-A-88/10419, WO-A-90/00904, WO-A-91/12024, WO-A-93/02711 or WO-A-96/39367.

However, OMRI contrast agents useful in the present method are not limited to paramagnetic organic free radicals. Particles exhibiting the magnetic properties of superparamagnetism, ferromagnetism or ferrimagnetism may also be useful OMRI contrast agents, as may be other particles having associated free electrons. Superparamagnetic nanoparticles (eg. iron or iron oxide nanoparticles) may be particularly useful Magnetic particles have the advantages over organic free radicals of high stability and a strong electronic/nuclear spin coupling (ie. high relaxivity) leading to greater Overhauser enhancement factors.

For ease of separation of the OMRI contrast agent and the MR imaging agent, it is particularly preferred that the combination of the two be a heterogeneous system, eg. a two phase liquid, a solid in liquid suspension or a relatively high surface area solid substrate within a liquid, eg. a solid in the form of beads fibres or sheets disposed within a liquid phase MR imaging agent. In all cases, the diffusion distance between the MR imaging agent and OMRI contrast agent must be small enough to achieve an effective Overhauser enhancement. Certain OMRI contrast agents are inherently particulate in nature, eg. the paramagnetic particles and superparamagnetic agents referred to above, others may be immobilized on, absorbed in or coupled to a solid substrate or support (eg. an organic polymer or inorganic matrix such as a zeolite or a silicon material) by conventional means. Strong covalent binding between OMRI contrast agent and solid substrate or support will, in general, limit the effectiveness of the agent in achieving the desired Overhauser effect and so it is preferred that the binding, if any, between the OMRI contrast agent and the solid support or substrate is weak so that the OMRI contrast agent is still capable of free rotation. The OMRI contrast agent may be bound to a water insoluble substrate/support prior to the polarisation or the OMRI contrast agent may be attached/bound to the substrate/support after polarisation. The OMRI contrast agent may then be separated from the MR imaging agent e.g. by filtration before administration. The OMRI contrast agent may also be bound to a water soluble macromolecule and the OMRI contrast agent-macromolecule may be separated from the MR imaging agent before administration.

For in vivo imaging, the MR imaging agent used in the present method should have nuclei (eg. protons) capable of emitting magnetic resonance signals and should of course be physiologically tolerable or be provided in a physiologically tolerable form. Besides protons other MR imaging nuclei may of course be used, eg, $^{19}F$, $^{13}C$, $^{31}P$ and sodium. Preferred MR imaging agents according to the invention exhibit the properties of inter alia high stability to oxygen, to pH (eg. in the pH range 5–9), to physiological temperatures and are stable in body fluids. They are of course non-toxic and preferably are rapidly excreted.

Conveniently, the imaging agent once polarised will remain so for a period sufficiently long to allow the imaging procedure to be comfortably carried out. Conveniently, significant polarisation will be retained for at least 1s, preferably at least 10s, more preferably at least 100s and especially preferably 1000s. In one embodiment of the method of the invention, the polarised MR imaging agent may be stored in frozen form. At low temperatures the polarisation is retained longer and thus the polarised MR imaging agent may be conveniently stored eg. in liquid nitrogen. Prior to use, it may be rapidly warmed to physiological temperatures using conventional techniques such as infrared or microwave radiation.

Particularly preferred MR imaging agents are physiologically tolerable aqueous solutions (eg. saline) in which protons are the imaging nuclei of interest. However water itself is especially preferred and has the advantage of being physiologically tolerable and may be administered to the subject free from carriers, excipients or formulation aids. With water as the MR imaging agent, the OMRI contrast agent may be chosen to be water soluble (eg. typically the water soluble free radicals described in WO-A-93/02711), or capable of being dispersed in water or suspended in water to produce the desired composition for use in the method according to the invention. The composition may be conveniently stored in this "ready to use" form prior to use. Thus viewed from a further aspect the present invention provides a kit comprising an aqueous solution or heterogeneous phase composition of an OMRI contrast agent together with a means for administering water from said solution or composition to a sample in the absence of substantially the whole of said OMRI contrast agent. In a preferred embodiment, the kit comprises an OMRI contrast agent, a means for immobilising said OMRI contrast agent, an MR imaging agent and a means for delivering said MR imaging agent in the absence of substantially the whole of said OMRI contrast agent, eg. by a plunger or pressure applicator.

The method according to the invention has the benefit of being able to provide significant spatial weighting to a generated image. In effect, the administration of a polarised MR imaging agent to a selected region of a sample (eg. by injection) means that the contrast effect is, in general, localised to that region. This of course depends on the extent of biodistribution over the period in which the MR imaging agent remains significantly polarised. In general, specific body volumes (i.e. regions of interest) may be defined with improved signal to noise properties of the resulting images in these volumes.

In one embodiment, a "native image" of the sample (e.g. body) (ie. one obtained prior to administration of the MR imaging agent or one obtained for the administered MR imaging agent without prior Overhauser enhancement as in a conventional MR experiment) may be generated to provide structural (eg. anatomical) information upon which the image obtained in the method according to the invention may be superimposed. This is a particularly useful aspect of the present method given that the polarisation of the MR imaging agent may only last for a short period and so biodistribution within the timescale of the measurement may be limited.

Given that the method of the invention should be carried out within the time that the MR imaging agent remains significantly polarised, once separation has been achieved it is desirable for administration of the MR imaging agent to be effected rapidly and for the MR measurement to follow shortly thereafter. This means that the sample (eg. body or organ) should be available close to the area in which the polarisation has been carried out. The preferred administration route for the MR imaging agent is by injection (eg. bolus injection) or where the lungs are to be imaged by spray, eg. aerosol spray.

The separation step of the method of the invention is intended to remove substantially the whole of the OMRI contrast agent from the composition (or at least to reduce it to physiologically tolerable levels) as rapidly as possible. Many physical and chemical separation or extraction techniques are known in the art and may be employed to effect rapid and efficient separation of the OMRI contrast agent and MR imaging agent. Clearly the more preferred separation techniques are those which can be effected rapidly and particularly those which allow separation in less than one second. In this respect, magnetic particles (eg. superparamagnetic particles) may be advantageously used as the OMRI contrast agent as it will be possible to make use of the inherent magnetic properties of the particles to achieve rapid separation by known techniques. Similarly, where the OMRI contrast agent is a solid bound to a magnetic bead, it may be conveniently separated from the liquid by an appropriately applied magnetic field.

Where the combination of an OMRI contrast agent and MR imaging is a heterogeneous system, it will be possible to use the different physical properties of the phases to carry out separation by conventional techniques. For example, where one phase is aqueous and the other non-aqueous (solid or liquid) it may be possible to simply decant one phase from the other. Alternatively, where the OMRI contrast agent is a solid or solid substrate (eg. a bead) suspended in a liquid MP imaging agent the solid may be separated from the liquid by conventional means eg. filtration, gravimetric, chromatographic or centrifugal means.

It is also envisaged that the OMRI contrast agents may comprise lipophilic moieties and so be separated from the MR imaging agent by passage over or through a fixed lipophilic medium or the OMRI contrast agent may be chemically bound to a lipophilic solid bead.

One separation technique makes use of a cation exchange polymer and a cationic OMRI contrast agent, eg. a trityl carrying pendant carboxylate groups. Alternatively acidifying the solution to around pH 4 may cause the OMRI contrast agent to precipitate out. Separation may then be carried out for example by filtration followed by neutralisation. An alternative technique involves adding ions which causes precipitation of ionic OMRI agents which may then be filtered off.

Certain OMRI contrast agents, such as the trityl agents, may have an affinity for proteins. Thus, after polarisation, a composition containing an OMRI contrast agent with a protein affinity may be passed through or over a protein in a form which exposes a large surface area to the agent eg. in particulate or surface bound form. In this way, binding of the OMRI contrast agent to the protein enables it to be removed from the composition.

The OMRI contrast agent will always have a molecular weight larger than that of water and therefore, in general, normal filtering techniques can be used for separating molecules with buffered molecules, ie. hollow fibres.

The MR imaging agents may be conveniently formulated with conventional pharmaceutical or veterinary carriers or excipients. MR imaging agent formulations manufactured or used according to this invention may contain, besides the MR imaging agent, formulation aids such as are conventional for therapeutic and diagnostic compositions in human or veterinary medicine. Thus the formulation may for example include stabilizers, antioxidants, osmolality adjusting agents, solubilizing agents, emulsifiers, viscosity enhancers, buffers, etc. Preferably none of such formulation aids will be paramagnetic, superparamagnetic, ferromagnetic or ferrimagnetic. The formulation may be in forms suitable for parenteral (eg. intravenous or intraarterial) or enteral (eg. oral or rectal) application, for example for application directly into body cavities having external voidance ducts (such as the lungs, the gastrointestinal tract, the bladder and the uterus), or for injection or infusion into the cardiovascular system. However solutions, suspensions and dispersions in physiological tolerable carriers eg. water will generally be preferred.

For use in in vivo imaging, the formulation, which preferably will be substantially isotonic, may conveniently be administered at a concentration sufficient to yield a 1 micromolar to 10M concentration of the MR imaging agent (or even higher where the MR imaging agent is water) agent is in the imaging zone; however the precise concentration and dosage will of course depend upon a range of factors such as toxicity, the organ targeting ability of the MR imaging agent, and the administration route. The optimum concentration for the MR imaging agent represents a balance between various factors. In general, optimum concentrations would in most cases lie in the range 0.1 mM to 10M (or even higher where the MR imaging agent is water), preferably more than 10 mM, especially more than 100 mM. In certain circumstances concentrations above 1M are preferred. Where water is the MR imaging agent the concentration is approximately 56M. Formulations for intravenous or intraarterial administration would preferably contain the MR imaging agent in concentrations of 10 mM to 10M (or even higher where the MR imaging agent is water), especially more than SOMM. For bolus injection the concentration may conveniently be 0.1 mM to 56M, preferably more than 0.2 mM, more preferably more than 0.5 mM, still more preferably more than 1.0 mM, yet still more preferably more than 5 mM, especially preferably more than 6 mM. In certain circumstances, the preferred concentration is above 1M, even more preferably above 5M For water as the MR imaging agent the concentration is approximately 56M.

Parenterally administrable forms should of course be sterile and free from physiologically unacceptable agents, and should have low osmolality to minimize irritation or other adverse effects upon administration and thus the formulation should preferably be isotonic or slightly hypertonic. Suitable vehicles include aqueous vehicles customarily used for administering parenteral solutions such as Sodium Chloride solution, Ringer's solution, Dextrose solution, Dextrose and Sodium Chloride solution, Lactated Ringer's solution and other solutions such as are described in Remington's Pharmaceutical Sciences, 15th ed., Easton: Mack Publishing Co., pp. 1405–1412 and 1461–1487 (1975) and The National Formulary XIV, 14th ed. Washington: American Pharmaceutical Association (1975). The compositions can contain preservatives, antimicrobial agents, buffers and antioxidants conventionally used for parenteral solutions, excipients and other additives which are compatible with the MR imaging agents and which will not interfere with the manufacture, storage or use of the products.

Where the MR imaging agent is to be injected, it may be convenient to inject simultaneously at a series of administration sites such that a greater proportion of the vascular tree may be visualized before the polarization is lost through relaxation.

The dosages of the MR imaging agent used according to the method of the present invention will vary according to the precise nature of the MR imaging agents used, of the tissue or organ of interest and of the measuring apparatus. Preferably the dosage should be kept as low as possible while still achieving a detectable contrast effect. In general, the maximum dosage will depend on toxicity constraints.

The following Example is intended to illustrate the invention in a non-limiting manner.

EXAMPLE

Figure 3:
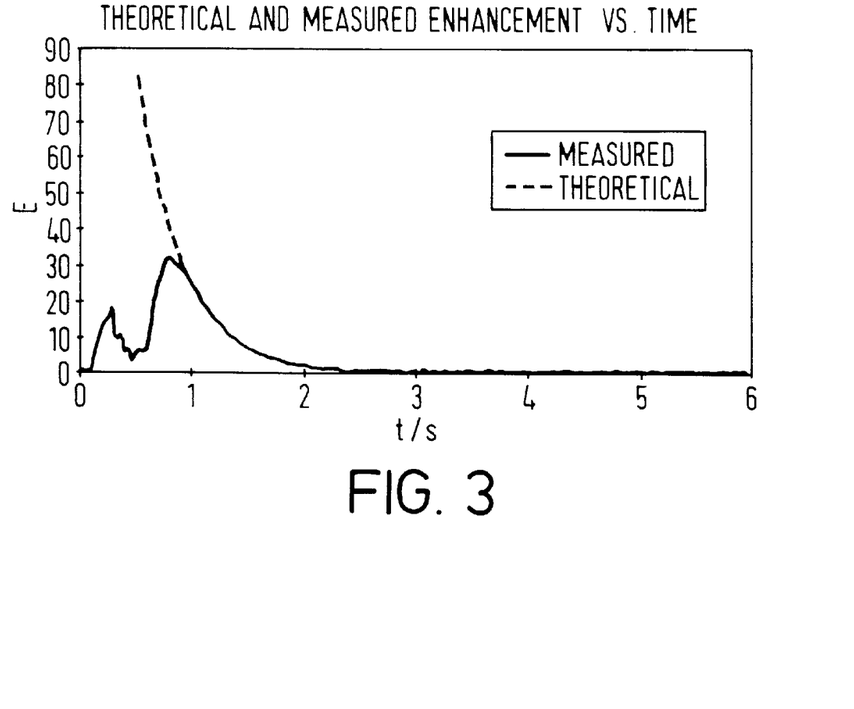
Figure 5:
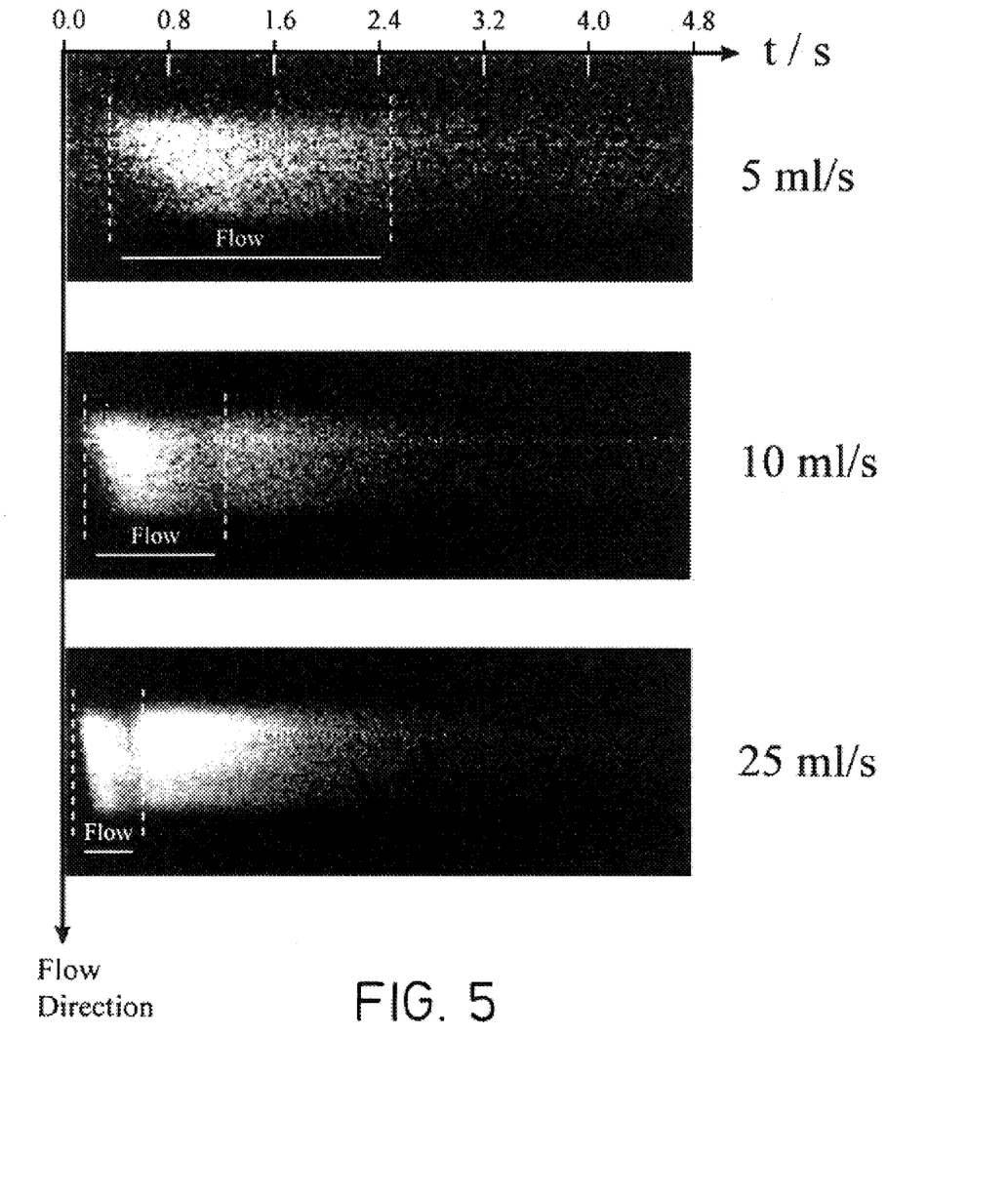

Experiments were carried out to determine optimum imaging sequences for fast flow, filter performance and preferred types of resonator.
Resonators A number of resonators were built and investigated and the most suitable at a frequency of 2.4 GHz was a co-axial one with a volume of 12 ml capable of taking the maximum pressure of an injection apparatus (40 atm). The dead volume between resonator and image phantom (a tube of 25 mm/ml section) was 5 ml. This resonator had good efficiency and approximately 2 W of power was required to saturate a bolus of 12 ml. The power could be increased by connecting several resonators in parallel.
Flow Experiments t-z images of a tube flow phantom were taken at different times (see FIG. 5—z-axis along the tube and in the direction of flow; FE 24/10; flip angle 3 deg; 10 W saturating power) and the signal at one position in the tube with respect to time is shown in FIG. 3. The signal in FIG. 3 is indicated as the overhauser enhancement factor (i.e. signal divided by proton signal value). The proton signal value was measured by performing the same experiment in the absence of UHF power.

The curve fell exponentially in the region where flow has stopped with the expected $T_1$ value. Extrapolating to t=0 i.e. pre-injection gave an Overhauser enhancement of 90 which is reduced by a factor of 2–3 during flow. This is probably caused by the different flow velocities at the tube centre and tube walls which leads to a voxel of non-uniform phase Thus during the echo time the mean distance travelled is 6 mm or slightly less than the tube diameter. The fluid at the centre travels 2–3 mm s$^{-1}$ further than that at the wall and as a result the voxel (which is a 1 mm thick and 7 mm diameter disc perpendicular to the tube axis) is non-uniform. Each 1 mm (pixel thickness along gradient) difference in distance travelled during the echo-time dephases the spins by 360°. The conclusion drawn is that voxels must be small in all directions and fast imaging techniques are required (eg. echo planar).

Figure 4:
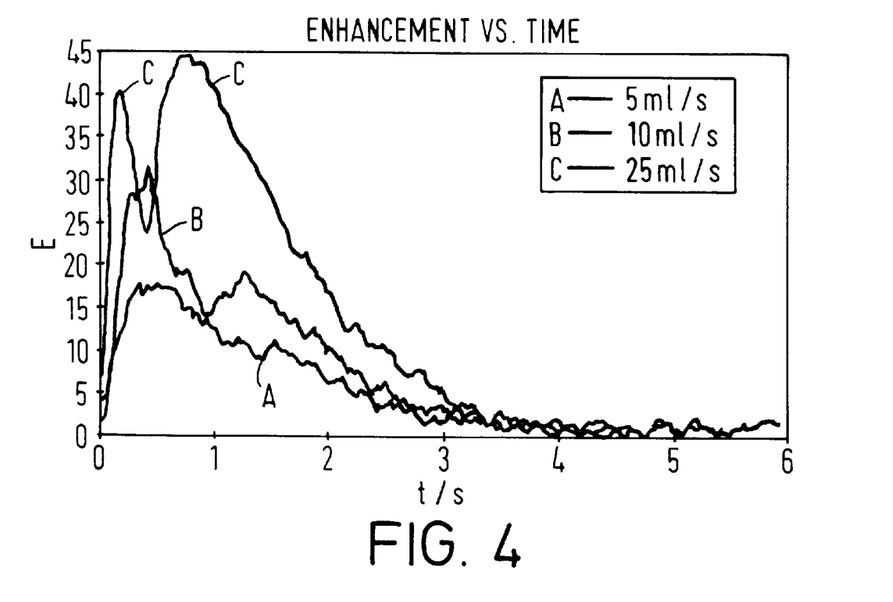

The same experiment was performed at lower velocities (see FIG. 4). At the higher setting of the motor syringe the signals "dip" after the first maximum whilst the flow accelerated to a maximum before it was stopped. The dip was less pronounced for slower flows but the overall signal was lower because of the $T_1$ effect.

Figure 6:
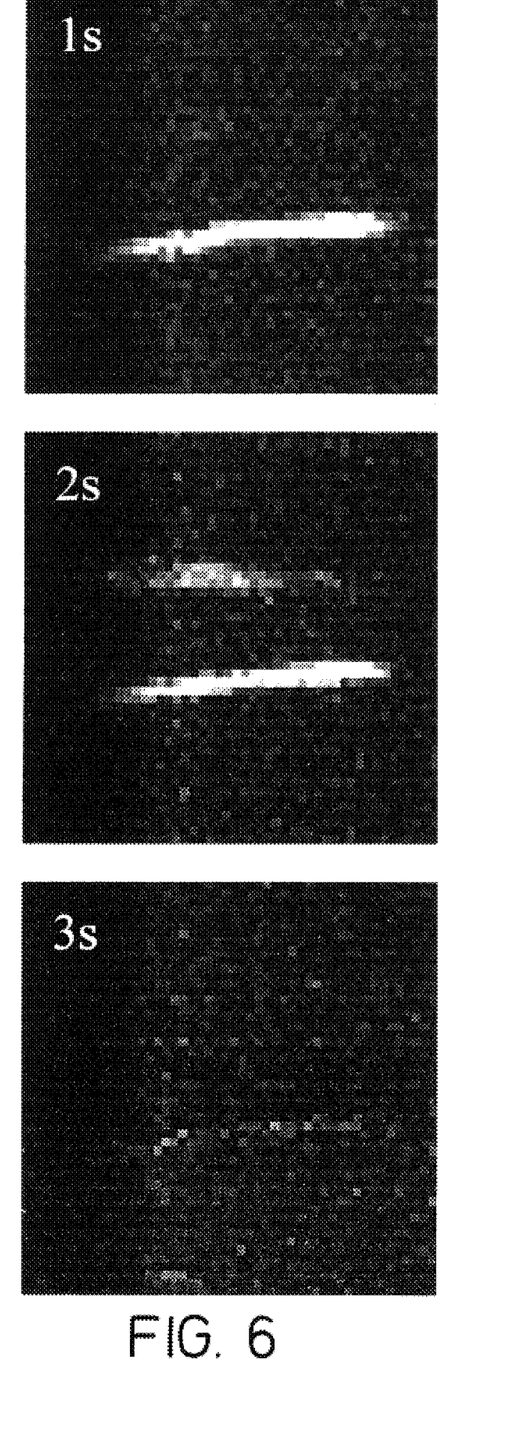

Imaging was also performed using a turbo-flash our: sequence with is imaging time, FE 10/3.8, FOV 200 mm, flip angle 5 deg and a flow phantom consisting of 2 tubes (diameter 5 and 7 mm respectively). The best images were obtained at the lowest flow velocity of 5 ml/s with approx. 1 mM of the chosen radical tris-(8-carboxyl-2,2,6,6-tetrakis-methyl-benzo[1,2d:4,5-d']bis(1,3)dithiole)methyl sodium salt (see FIG. 6 for 2D images at 1s, 2s and 3s)

Figure 7:
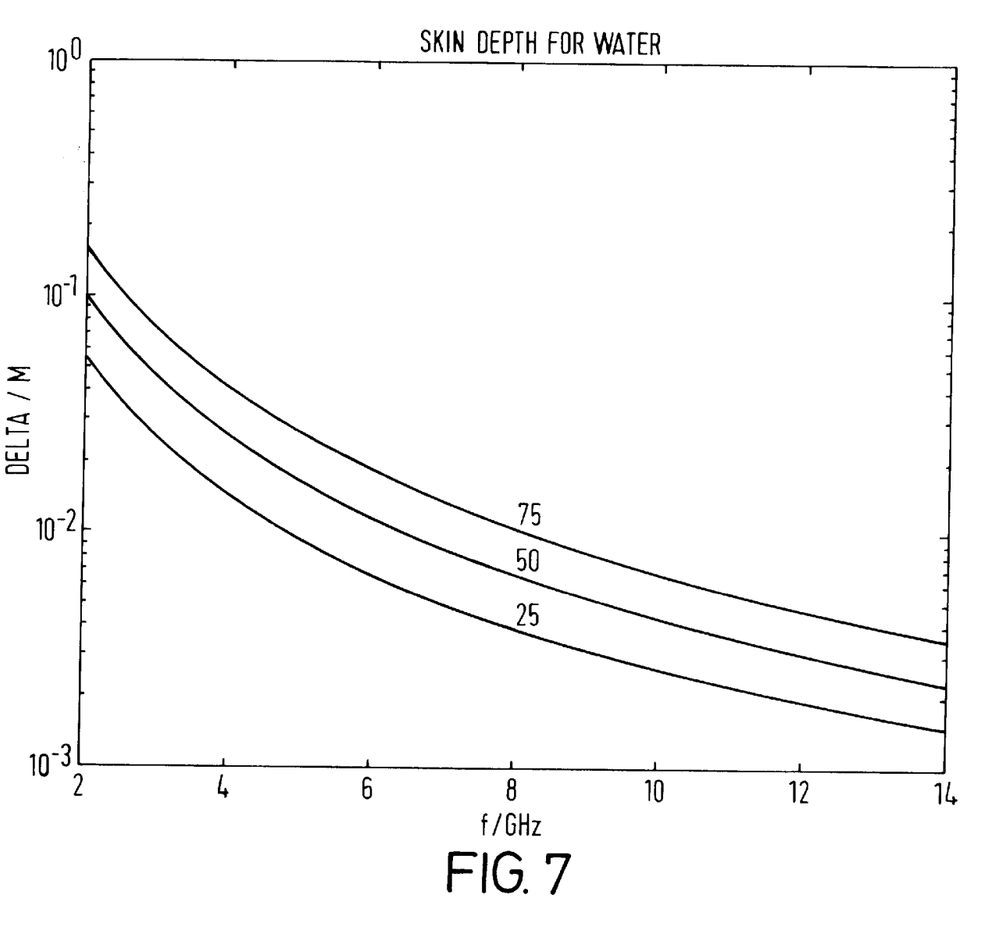
Figure 8:
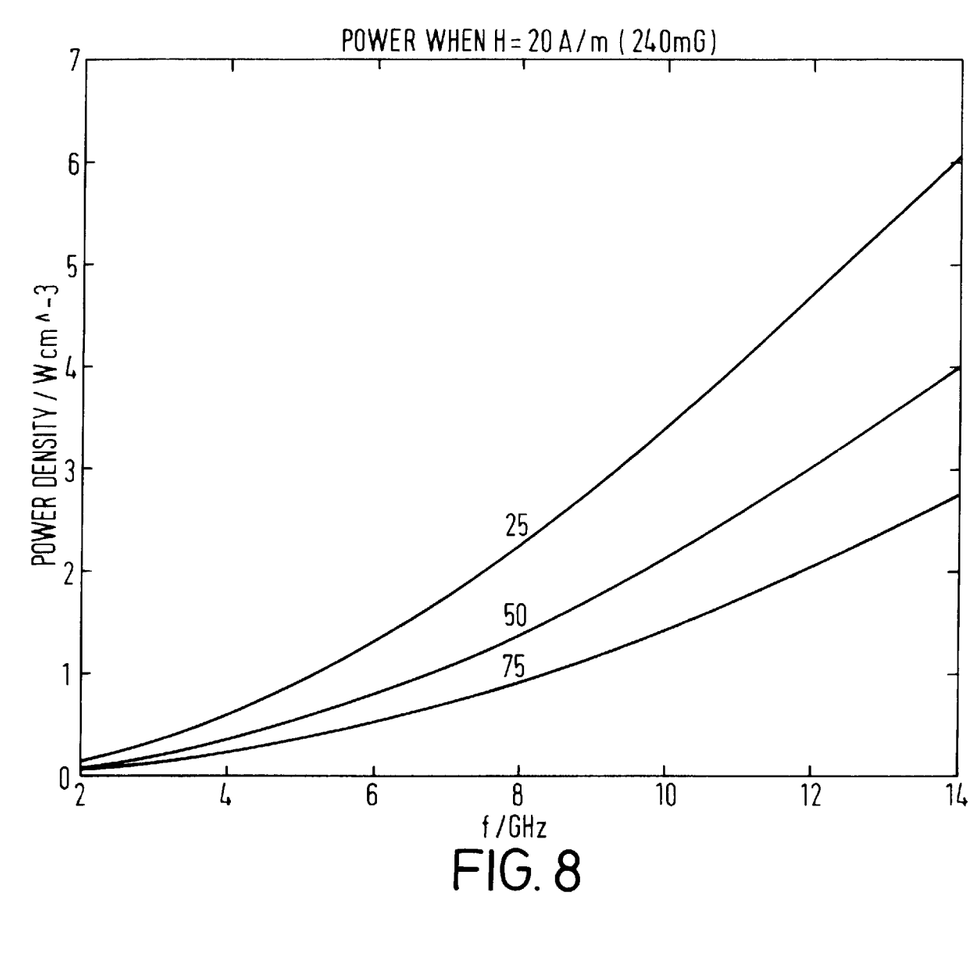

In general, it was found that filtering shortened the $T_1$ values due to the material used in the filters.
Microwave Polarisers—Calculations and Design Microwave losses in polarised boluses of mannitol solution equate to that of water at the frequency of interest. A bolus was irradiated with a plane wave, the penetrating portion of which was reflected back with a metal plate. FIG. 7 shows skin depth as a function of frequency for three different temperatures 25° C., 50° C. and 75° C. (the power of a plane wave is attenuated to 1/e when penetrating this distance). A slab of approximately one skin depth thickness could be polarised with a $B_1$-field of 20 A/m (equivalent to 240 mG), allowing the power of the requisite plane wave per cm$^3$ water to be computed. The results are shown in FIG. 8 at the three different temperatures (the heating of the bolus during approximately 1s of polarisation was negligible).

Figure 9:
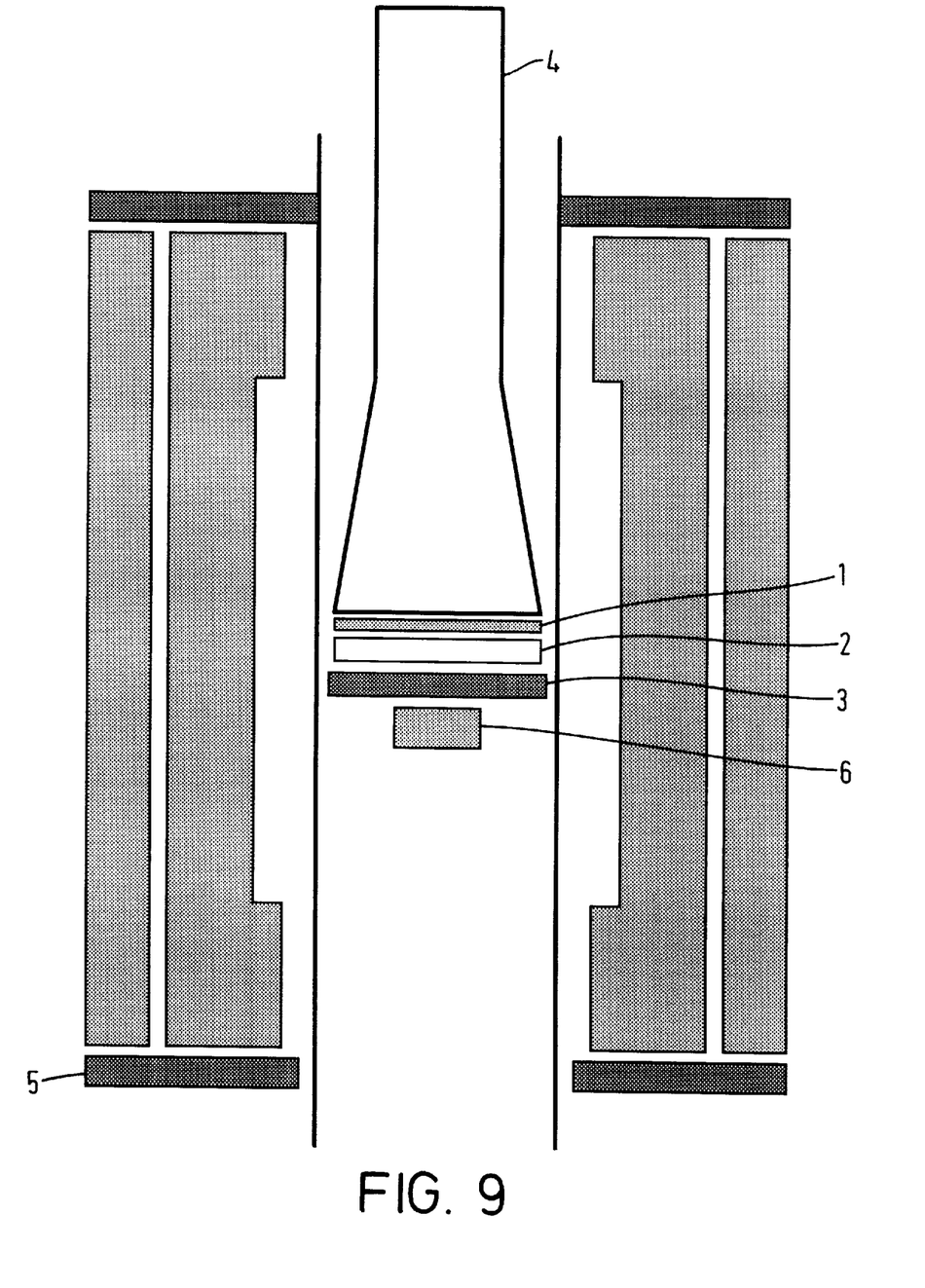

With a view to reducing the required power and therefore saving costs, an alternative to the arrangement of a plane wave on a slab is shown schematically in Figure 9 for 0.23T. It is based on a horn antenna (4) placed inside a polarising magnet (5). The magnet can be used in the pulsed mode, keeping it on only during the polarization process. This is made possible by the esr unit (6) which automatically locks to the field. The term locking means that the unit produces a UHF signal at exactly the esr resonance frequency for the magnetic field in the magnet, thereby compensating for field drift caused by the pulsed mode. The esr unit is identical to the one used in the Outlook commercial MRI scanner described in U.S. Pat. No. 5,488,950. The bolus (2) is placed adjacent to a metal plate (3) which will reflect the UHF wave and at the same time make the electric field vector of the wave equal to zero at the interface. This will make losses in the water small; they are zero at the interface and progressively increase away from it. The loss per unit volume of water can be decreased by using a thinner layer of water at the expense of bolus volume. On the other side of the bolus is a dielectric layer (1) By choosing a suitable material with low microwave losses and a suitable dielectric constant together with a suitable thickness of the plate, the reflection of the incident (approximately plane) wave from the horn antenna can be made insignificant. By impedance matching the horn antenna in this way to the layered arrangement, the polarizing effect for a given microwave incident power is maximized.

We claim:

1. A method of magnetic resonance investigation of a sample comprising
   (i) placing a composition comprising an OMRI contrast agent and an MR imaging agent containing nuclei capable of emitting magnetic resonance signals in a uniform magnetic field;
   (ii) exposing said composition to a first radiation of a frequency selected to excite electron spin transitions in said OMRI contrast agent;
   (iii) separating the whole, substantially the whole, or a portion of said OMRI contrast agent from said MR imaging agent;
   (iv) administering said MR imaging agent to said sample;
   (v) exposing said sample to a second radiation of a frequency selected to excite nuclear spin transitions in said MR imaging nuclei;
   (vi) detecting magnetic resonance signals from said sample; and
   (vii) optionally, generating an image or dynamic flow data from said detected signals.

2. A method as claimed in claim 1 wherein substantially the whole of said OMRI contrast agent is separated from said MR imaging agent.

3. A method as claimed in claim 1 wherein said OMRI contrast agent comprises a paramagnetic free radical.

4. A method as claimed in claim 1 wherein said OMRI contrast agent comprises a triarylmethyl radical.

5. A method as claimed in claim 1 wherein said MR imaging agent is a physiologically tolerable aqueous solution.

6. A method as claimed in claim 1 wherein said MR imaging agent is water.

7. An apparatus suitable for use in the method as claimed in claim 1 comprising a first polarising magnet providing a magnetic field for dynamic nuclear polarisation of a composition comprising an OMRI contrast agent and an MR imaging agent containing nuclei capable of emitting magnetic reasonance signals in a uniform magnetic field; and a second magnet providing the primary magnetic field for MR imaging of the sample.

8. An apparatus as claimed in claim 7 comprising a dielectric resonator to provide said dynamic nuclear polarisation.

9. An apparatus as claimed in claim 7 comprising a pump together with a delivery line for delivering the contrast composition to the subject.

10. An apparatus as claimed in claim 7 wherein said composition is dispersed into a plurality of compartments during the dynamic nuclear polarisation step.

11. An apparatus as claimed in claim 8 comprising a pump together with a delivery line for delivering the contrast composition to a subject.

12. An apparatus as claimed in claim 8 wherein said composition is dispersed into a plurality of compartments during the dynamic nuclear polarisation step.

13. An apparatus as claimed in claim 9 wherein said composition is dispersed into a plurality of compartments during the dynamic nuclear polarisation step.

14. A method as claimed in claim 2 wherein said OMRI contrast agent comprises a paramagnetic free radical.

15. A method as claimed in claim 2 wherein said OMRI contrast agent comprises a triarylmethyl radical.

16. A method as claimed in claim 1 wherein said OMRI contrast agent comprises a triarylmethyl radical.

17. A method as claimed in claim 2 wherein said MR imaging agent is a physiologically tolerable aqueous solution.

18. A method as claimed in claim 3 wherein said MR imaging agent is a physiologically tolerable aqueous solution.

19. A method as claimed in claim 4 wherein said MR imaging agent is a physiologically tolerable aqueous solution.

20. A method as claimed in claim 2 wherein said MR imaging agent is water.

* * * * *